United States Patent [19]

Sawada

[11] Patent Number: 5,591,656
[45] Date of Patent: Jan. 7, 1997

[54] SEMICONDUCTOR INTEGRATED CIRCUIT DEVICE WITH SELF-ALIGNED SUPERHIGH SPEED BIPOLAR TRANSISTOR

[75] Inventor: Shigeki Sawada, Kyoto, Japan

[73] Assignee: Matsushita Electronics Corporation, Ltd., Osaka, Japan

[21] Appl. No.: 454,410

[22] Filed: May 30, 1995

Related U.S. Application Data

[62] Division of Ser. No. 384,694, Feb. 6, 1995, Pat. No. 5,504,368, which is a continuation of Ser. No. 936,117, Aug. 27, 1992, abandoned.

[30] Foreign Application Priority Data

Sep. 24, 1991 [JP] Japan ................................. 3-243058

[51] Int. Cl.$^6$ ................................................ H01L 21/265
[52] U.S. Cl. ............................... 437/31; 437/55; 437/51; 148/DIG. 10
[58] Field of Search ............................... 437/31, 32, 51, 437/55, 59; 148/DIG. 9, DIG. 10, DIG. 11

[56] References Cited

U.S. PATENT DOCUMENTS

| 3,912,555 | 10/1975 | Tsuyuki . |
| 4,826,780 | 5/1989 | Takemoto et al. . |
| 5,014,107 | 5/1991 | Vora . |
| 5,072,287 | 12/1991 | Nakagawa et al. . |
| 5,162,252 | 11/1992 | Kanda et al. . |

FOREIGN PATENT DOCUMENTS

| 0193934 | 9/1986 | European Pat. Off. . |
| 0250869 | 1/1988 | European Pat. Off. . |
| 3915634 | 11/1989 | Germany . |
| 56-150850 | 11/1981 | Japan . |
| 58-21366 | 2/1983 | Japan . |
| 63-43357 | 2/1988 | Japan . |
| 3019278 | 1/1991 | Japan . |

OTHER PUBLICATIONS

Kanzaki et al., "A New Super High Speed ECL Compatible I$^2$L Technology", Int'l Electron Devices Meeting, pp. 328–331 (Dec. 3–5, 1979).
European Search Report dated Sep. 18, 1995.
T. Nakamura et al., "Self–Aligned Transistor with Sidewall Base Electrode", IEEE Transactions On Electron Devices, vol. ED–29, No. 4, Apr. 1982.

Primary Examiner—Tuan H. Nguyen
Attorney, Agent, or Firm—Ratner & Prestia

[57] ABSTRACT

A superhigh speed vertical transistor having an ultra thin base, a vertical NPN transistor having a reverse direction structure for composing an IIL, and a lateral PNP transistor similarly composing an IIL to be an injector are formed on a P-type silicon substrate 1 by self-aligned and integrated. The emitter leading-out part opening of the superhigh speed vertical NPN transistor and the collector leading-out part opening of the vertical NPN transistor having a reverse direction structure are self-aligned to the base leading-out electrode. In the epitaxial layer, the P-type intrinsic base layer of superhigh speed vertical NPN transistor is formed by impurity diffusion from the emitter leading-out electrode formed of polysilicon film, and the P-type base layer of the vertical NPN transistor having a reverse direction structure is formed by ion implantation. By thus forming the superhigh speed vertical NPN transistor having a reverse direction structure in self-aligned process, the superhigh speed vertical NPN transistor of self-aligned type and IIL device may be integrated on a same chip. Besides, by forming the intrinsic base layer of the vertical NPN transistor having a reverse direction structure deeper in junction than the base layer formed by impurity diffusion from the polysilicon emitter electrode for the superhigh speed NPN transistor of self-aligned type, the low concentration epitaxial layer part beneath the intrinsic base layer for composing the emitter of the vertical NPN transistor having a reverse direction structure may be made smaller, thereby avoiding lowering of the current gain of the vertical NPN transistor having a reverse direction structure and lowering of high speed operation of IIL device accompanying accumulation of minority carrier.

2 Claims, 3 Drawing Sheets

SEMICONDUCTOR INTEGRATED CIRCUIT DEVICE WITH SELF-ALIGNED SUPERHIGH SPEED BIPOLAR TRANSISTOR

This application is a division of application Ser. No. 08/384,694, filed Feb. 6, 1995, now U.S. Pat. No. 5,504,368 which is a continuation of application Ser. No. 07/936,117, filed on Aug. 27, 1992, now abandoned.

BACKGROUND Of THE INVENTION

1. Field of the Invention

The present invention relates to a semiconductor integrated circuit device and a method of fabricating the same, and more particularly to forming of a superhigh speed bipolar transistor of self-aligned type and an IIL device on the same semiconductor substrate.

2. Description of the Prior Art

It is easy to integrate high speed ECL (emitter-coupled logic) circuit, analog circuit, and other bipolar circuit on a same chip. Accordingly, IIL (integrated injection logic) devices are widely used in an integrated circuit in which digital circuits and analog circuits coexist.

A circuit diagram of an IIL device is shown in FIG. 3.

The vertical transistor composing the IIL device is different from an ordinary vertical transistor because the carrier moves in the reverse direction. In the ordinary vertical transistor, the emitter, base and collector are disposed sequentially from the diffusion layer of high concentration close to the surface. By contrast, in the vertical transistor of IIL device, the collector, base and emitter are disposed in this order from the diffusion layer of high concentration close to the surface. In other words, the vertical transistor of IIL device possesses a reverse direction structure as compared with the ordinary vertical transistor. The IIL device is a logic device composed of a vertical NPN transistor 1 having such reverse direction structure, and a lateral PNP transistor 2.

The lateral PNP transistor 2 has a complex structure using the base of the vertical NPN transistor 1 of reverse direction structure as its collector. Here, the PNP transistor 2 functions as an injector 3 for injecting holes to the base of the NPN transistor 1. On the other hand, the vertical NPN transistor 1 functions as an inverter.

Recent bipolar transistors are meanwhile, made finer and smaller by employing the self-aligned technology, and a high speed ECL circuit may be realized, as disclosed in the Japanese Patent Publication Hei. 2-108451. This disclosure is explained below while referring to drawings.

FIGS. 4 (a) to (d) are process sequence sectional views for explaining the manufacturing method of NPN bipolar transistor employing the conventional self-aligned technology.

A buried collector layer 12 is formed on the surface of a silicon substrate 11. Later, an epitaxial layer 13 is grown on the buried collector layer 12. Consequently, a LOCOS film 14 for electrical isolation is formed in a specified region on the surface of the buried collector layer 12. Afterwards, a polysilicon film as a base leading-out electrode 15 and then an oxide film 16 are grown on the entire surface. Furthermore, by ion implantation, boron as an impurity is implanted into the polysilicon film which is used as the base leading-out electrode 15. Using the resist employed in the photolithography as the mask, the oxide film 16 and the polysilicon film as base leading-out electrode 15 are selectively removed by etching. In this way, an intrinsic base region 17 is exposed on the surface of the epitaxial layer 13 (FIG. 4 (a)).

Next, a nitride film 18 is grown on the oxide film 16 and intrinsic base region 17. Then, by heat treatment, the boron is introduced into the peripheral part of the intrinsic base region 17 on the surface of the epitaxial layer 13 from the polysilicon film as the base leading-out electrode 15, and an extrinsic base layer 19 is formed (FIG. 4 (b)).

Furthermore, a polysilicon film is grown on the entire surface. Later, this polysilicon film is etched anisotropically. By this etching, a polysilicon side-wall 20 is formed on the side wall of the polysilicon film 15 as the base leading-out electrode. Using this polysilicon side-wall 20 as mask, the nitride film 18 is removed by etching. Consequently, an emitter leading-out electrode part opening 21 is self-aligned to the polysilicon film as the base leading-out electrode 15 (FIG. 4 (c)).

Finally, a polysilicon film is grown on the entire surface. Then the polysilicon film is etched by using the resist formed by photolithography as mask. As a result, an emitter leading-out electrode 22 is formed. As an impurity, then, boron is implanted into the emitter leading-out electrode 22 by ion implantation. By subsequent heat treatment, the boron is introduced into the intrinsic base region 17 on the surface of the epitaxial layer 13 through the emitter leading-out electrode part opening 21. In this way, an intrinsic base layer 23 is formed. As other impurity, arsenic is implanted into the emitter leading-out electrode 22 by ion implantation. By subsequent heat treatment, the impurity arsenic is introduced into the intrinsic base layer 23 through the emitter leading-out electrode part opening 21. Thus, an emitter layer 24 is formed (FIG. 4 (d)).

In such prior art, emitter leading-out electrode part opening 21 and emitter layer 24 are self-aligned to the base leading-out electrode 15 of polysilicon film. Besides, the intrinsic base layer 23 is formed by diffusing the impurity from the polysilicon film as the emitter leading-out electrode 22. By using such conventional transistor structure, when attempting to integrate ECL circuit or high frequency linear circuit and IIL device on the same substrate, the following problems are involved.

A transistor operating at very high speed is formed by the self-aligned technology, while the IIL device is formed in other process steps. In this case, the number of process steps increases, and therefore the manufacturing cost soars and the production yield drops.

Accordingly, the vertical transistor having the reverse direction structure forming the IIL device must be formed by the self-aligned technology. Beneath the intrinsic base layer which is the emitter of the vertical transistor having the reverse direction structure, the epitaxial layer 13 is formed. The impurity concentration of the epitaxial layer 13 is lower than that of the buried collector layer 12 or intrinsic base layer 23. Therefore, when the thickness of the low impurity concentration region of the epitaxial layer 13 becomes larger, the carrier injection efficiency becomes low, and the current gain is lowered. Hence, the operation of the IIL device becomes unstable.

Or as the thickness of the impurity concentration region increases, the minority carrier accumulates in the epitaxial layer 13 as the emitter layer of the vertical transistor of reverse direction structure. And the minority carrier increases if operating the IIL device. The operating speed of the IIL device is determined by charging or discharging of the minority carrier. As a result, the operation speed of the IIL device declines.

In the light of the above problems, it is hence a primary object of the invention to present a semiconductor integrated circuit having an IIL device capable of operating stably at high speed without increasing the number of process steps or the manufacturing cost.

SUMMARY OF THE INVENTION

To solve the above-problems, the invention presents a semiconductor integrated circuit device comprising at least a first vertical semiconductor element having forward direction structure, and a second vertical semiconductor element having reverse direction structure within an IIL device, formed on a semiconductor substrate of a first conductive type, and also comprising an emitter layer of a second conductive type of the first vertical semiconductor element, a collector layer of the second conductive type of the second vertical semiconductor element, an extrinsic base layer of the first conductive type of the first vertical semiconductor element, and a base contact layer of the first conductive type of the second vertical semiconductor element, wherein the emitter layer is self-aligned to extrinsic base layer, and the collector layer is self-aligned to the base contact layer.

The invention also presents a semiconductor integrated circuit device comprising a semiconductor layer of a second conductive type formed on a semiconductor substrate of a first conductive type, two first diffusion layers of the first conductive type wherein one of the first diffusion layers is formed in a peripheral area of a first semiconductor element region in the semiconductor layer and the other first diffusion layers is formed in a peripheral area of a second semiconductor element region in the semiconductor layer, a first polycrystalline semiconductor film of the first conductive type formed as a leading-out electrode of the first diffusion layers, a second diffusion layer of the second conductive type formed between the first diffusion layers, and a second polycrystalline semiconductor film of the second conductive type formed as a leading-out electrode of the second diffusion layer, wherein a third diffusion layer of the first conductive type is formed in the first semiconductor element region at a depth shallower than the junction depth of the first diffusion layer, and a fourth diffusion layer of the first conductive type is formed in the second semiconductor element region at a depth deeper than the depth of the first diffusion layer.

To solve the above problems, the invention also presents a method of fabricating a semiconductor integrated circuit device comprising a step of forming a semiconductor layer of a second conductive type on a semiconductor substrate of a first conductive type, a step of forming a first diffusion layer of the first conductive type in a first semiconductor element region of the semiconductor layer, a step of forming a first polycrystalline semiconductor film on the semiconductor substrate, a step of forming a first insulating film on the first polycrystalline semiconductor film, a step of introducing a first impurity of the first conductive type into the first polycrystalline semiconductor film, a step of forming a first opening by selectively etching and removing the first insulating film and first polycrystalline semiconductor film, a step of forming a second insulating film at least in the first opening, a step of forming a second diffusion layer of the first conductive type by introducing the first impurity into the semiconductor layer, a step of forming a second opening in the second insulating layer, a step of growing a second polycrystalline semiconductor film in the second opening, a step of introducing a second impurity of the first conductive type selectively into the second polycrystalline semiconductor film in the second semiconductor element region other than the first semiconductor element region, a step of forming a third diffusion layer by introducing the second impurity into the semiconductor layer through the second opening, a step of introducing a third impurity of the second conductive type into all second polycrystalline semiconductor films, and a step of forming a fourth diffusion layer of the second conductive type by introducing the third impurity into the semiconductor layer through the second opening.

According to the semiconductor integrated circuit and the method of fabricating the same of the invention, the base leading-out electrode and collector layer of the vertical transistor having the reverse direction structure composing the IIL device may be formed in the same process step as the base leading-out electrode and emitter layer of the ordinary vertical transistor having the forward direction structure by employing the self-aligned technology.

As a result, by employing the self-aligned technology, the vertical transistor having the forward direction structure and the IIL device may be integrated in a same substrate.

In the vertical transistor of forward direction structure capable of operation at superhigh speed employing the self-aligned technology shown in the prior art, the base layer is formed by diffusing impurities from the emitter electrode as the polysilicon film. In the manufacturing method of the invention, meanwhile, the junction depth of the intrinsic base layer of the vertical transistor having the reverse direction structure of the IIL device is formed deeper than that of the vertical transistor having the forward direction structure.

Thus the region possessing the low impurity concentration of the epitaxial layer is made thin, and the current gain of the vertical transistor having the reverse direction structure will not be lowered.

Moreover, since the accumulated minority carrier does not increase, the IIL device may be operated at high speed.

DESCRIPTION OF THE PREFERRED EMBODIMENT

Figure 1:
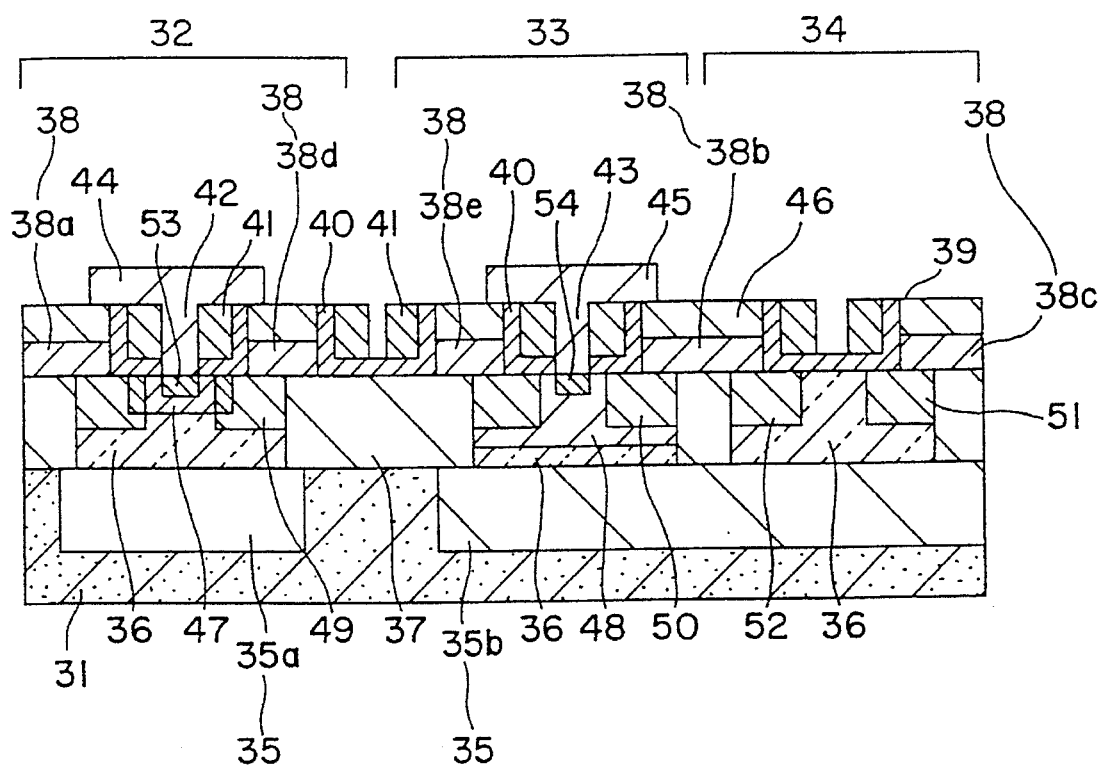
FIG. 1 is a sectional view showing the structure of a semiconductor integrated circuit in an embodiment of the invention.
Figure 3:
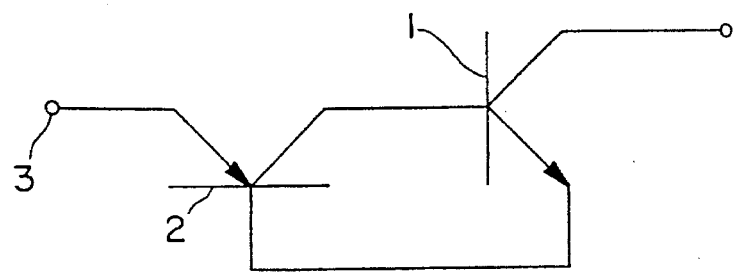
FIG. 3 is a circuit diagram showing the structure of a conventional IIL device.
Figure 2A:
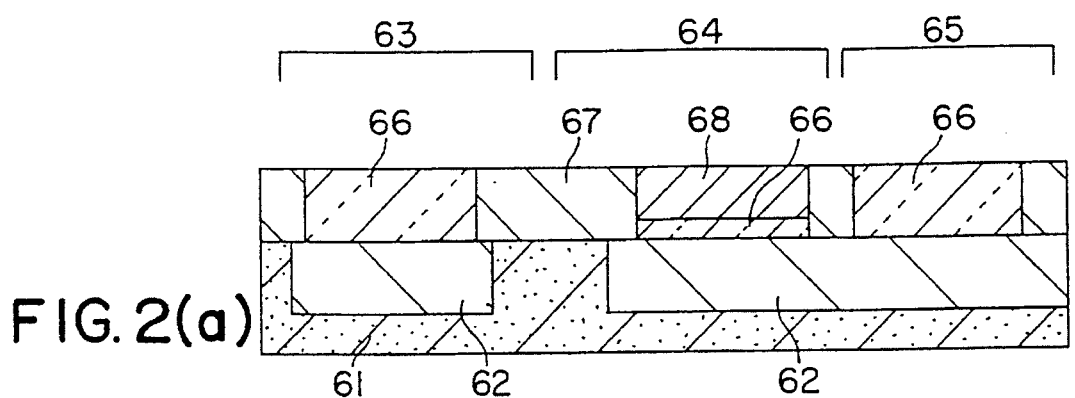
FIGS. 2 (a)–2 (d) are a process sequence sectional view showing the method of fabricating the semiconductor integrated circuit.
Figure 2B:
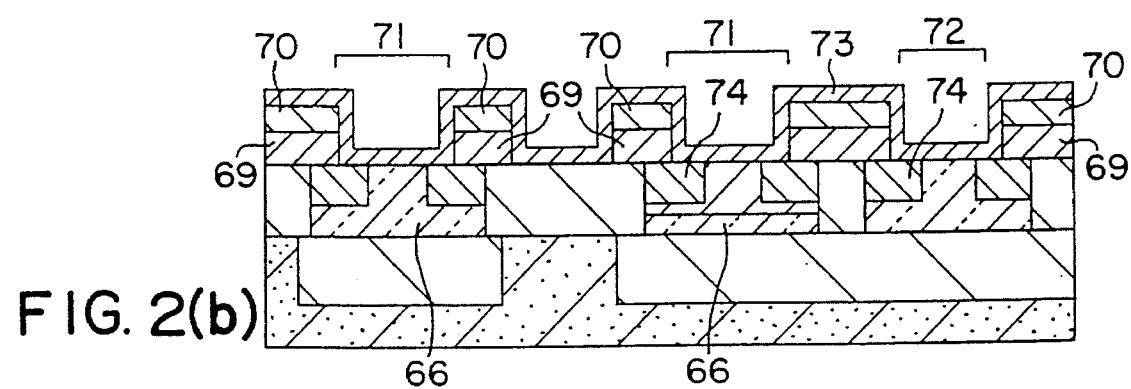
Figure 2C:
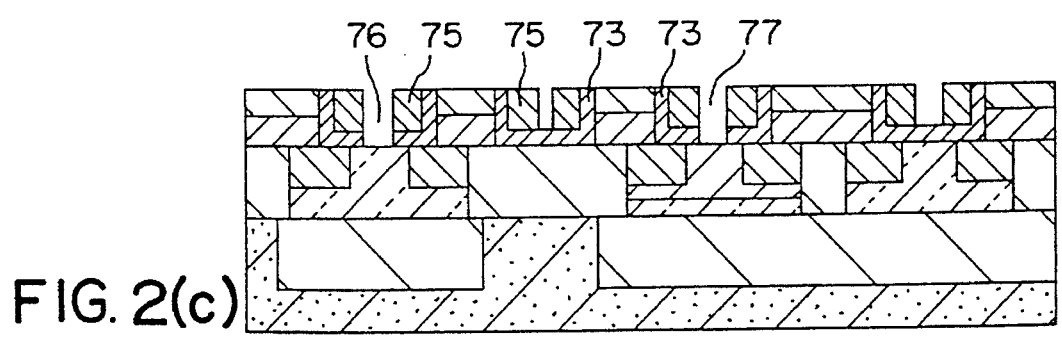
Figure 2D:
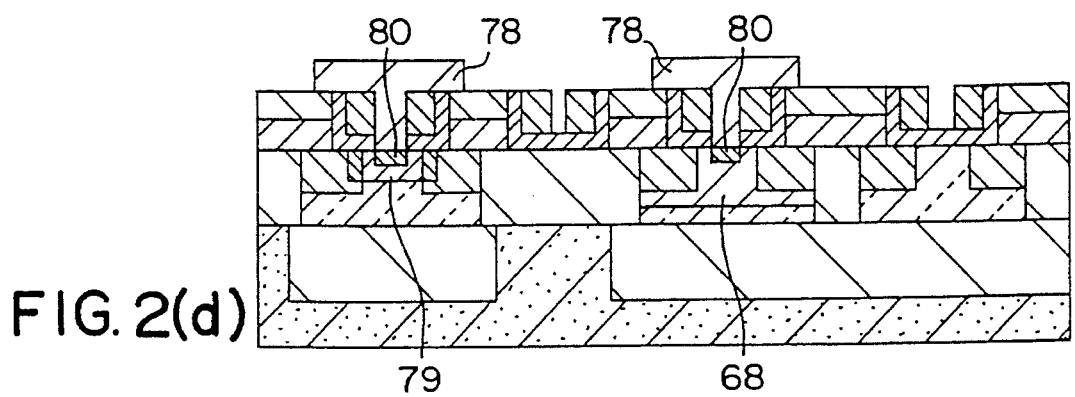
Figure 4A:
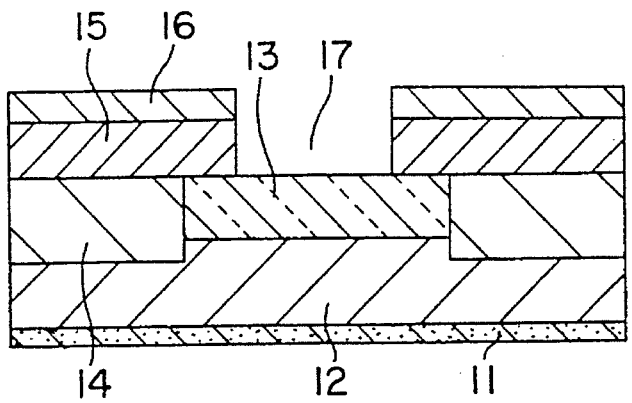
FIGS. 4 (a)–4 (d) are a process sequence sectional view showing the structure and fabricating method of a conventional superhigh speed transistor with self-alignment.
Figure 4B:
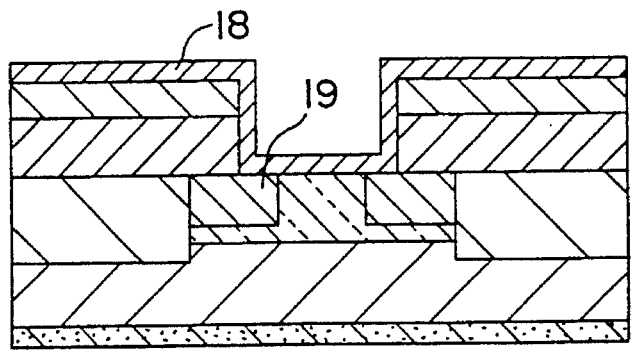
Figure 4C:
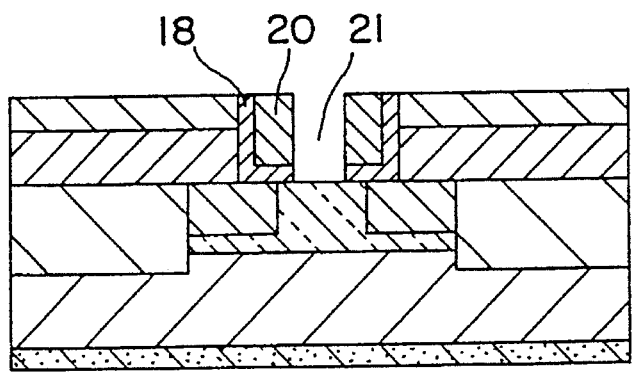
Figure 4D:
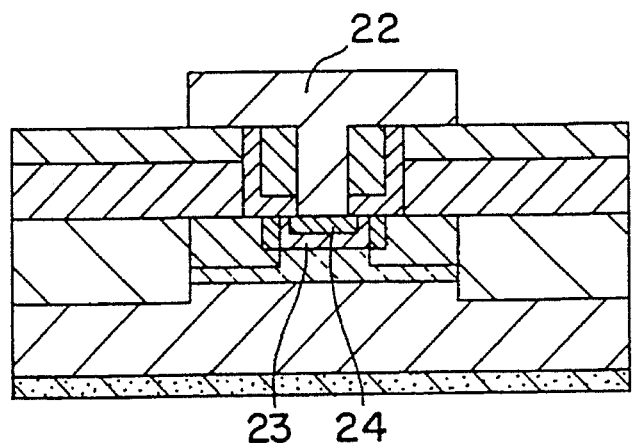

Referring now to the drawings, an embodiment of the invention is described below. FIG. 1 is a sectional view of a semiconductor integrated circuit in an embodiment of the invention.

A P-type silicon substrate 31 with a specific resistance of about 10 $\Omega$-cm is mainly composed of the following three regions. One is a region forming a vertical NPN transistor 32 in a forward direction structure having an extremely thin base and capable of operating at superhigh speed. The second is a region forming a vertical NPN transistor 33 in a reverse direction structure of IIL device. The third is a region forming a lateral PNP transistor 34 as injector of IIL device.

Using the P-type silicon substrate 31, the superhigh speed vertical NPN transistor 32 or the vertical NPN transistor 33 required to operate at high speed in the IIL device may be composed of a transistor having NPN type. Accordingly, the carrier moving speed is higher in the NPN transistor than in the PNP transistor. Besides, in relation to the diffusion speed of impurities, a shallower emitter-base junction is formed in the NPN transistor. Hence, the operating speed of the device can be increased.

An N-type buried layer 35 is formed in a specified region on the surface of the silicon substrate 31. The buried layer 35 consists of an N-type buried collector layer 35a of NPN transistor 32, and a buried emitter layer 35b of NPN transistor 33.

The buried emitter layer 35b of NPN transistor 33 functions also as the base leading-out electrode of the PNP transistor 34 of IIL device. The junction depth of the buried layer 35 is 1 to 2 μm, and its sheet resistance is 50 to 100 Ω/□.

If the junction depth of the buried layer 35 is 2 μm or more, the parasitic junction capacitance becomes large. It prevents the device from operating at high speed. If the sheet resistance is more than 100 Ω/□, the parasitic resistance increases, thereby preventing the device from operating at high speed. Attempting to define the junction depth under 1 μm or the sheet resistance under 50 Ω/□ causes the surface concentration of the buried layer 35 to exceed $3 \times 10^{19}$ cm$^{-3}$. By the heat treatment after forming the buried layer 35, the impurity in the buried layer 35 builds up to the upper part. As a result, the breakdown voltage of the device deteriorates.

An N-type epitaxial layer 36 is formed on the buried layer 35. The film thickness of the epitaxial layer 36 is 1 μm, and its specific resistance is about 0.5 Ω-cm. The epitaxial layer 36 is used in a film thickness of about 0.6 to 1.2 μm. If the film thickness of the epitaxial layer 36 is great, the device operating speed becomes low. To the contrary, if the film thickness of the epitaxial layer 36 is small, the breakdown voltage of device declines.

The epitaxial layer 36 functions as collector in the NPN transistor 32, as emitter in the NPN transistor 33, and as base in the PNP transistor 34. Accordingly, in the NPN transistor 32, the portion of the epitaxial layer 35 is called an N-type epi-collector. Likewise, in the NPN transistor 33, it is called an epi-emitter.

Adjacent to the epitaxial layer 36, a LOCOS film 37 for electrical isolation is formed. The film thickness of the LOCOS film 37 is 1 to 1.5 μm. The LOCOS film 37 is provided in order to electrically isolate the NPN transistor 32 from the NPN transistor 33 and PNP transistor 34.

If the film thickness of the LOCOS film 37 is smaller than the film thickness of the epitaxial layer 36, the breakdown voltage drops between the silicon substrate 31 and P-type diffusion layer. Here, the P-type diffusion layer refers to the base layers 47, 48, extrinsic base layer 49 and base contact layer 50 of transistors 32, 33, and emitter layer 51 and collector layer 52 of PNP transistor 34 described below. A parasitic PNP transistor is composed of silicon substrate 31, epitaxial layer 36, and P-type diffusion layer.

When the parasitic PNP transistor is formed, the leak current between the silicon substrate 31 and P-type diffusion layer increases, latch-phenomenon occurs, or the characteristic deteriorates.

In a specified region, a P-type polysilicon film is formed. This polysilicon film 38 works as a base leading-out electrode 38a of the NPN transistor 32, a base leading-out electrode 38b of the NPN transistor 33, and an emitter leading-out electrode 38c of the PNP transistor 34 of an injector. The base leading-out electrode 38b also works as the collector leading-out electrode of the PNP transistor 34. The polysilicon film 38 also forms a base leading-out electrode 38d of the NPN transistor 32 and a base leading-out electrode 38e of the NPN transistor 33. The base leading-out electrodes 38d, 38e are provided in order to lower the respective base resistances.

The film thickness of the polysilicon film 38 is 400 nm, and its sheet resistance is about 100 Ω/□. The polysilicon film 38 is used in a film thickness of 300 to 500 nm. If the film thickness of the polysilicon film 38 is less than 300 nm, the sheet resistance increases. If the film thickness of the polysilicon film 38 is more than 500 nm, the step of the substrate surface increases.

The polysilicon film 38 is used at a sheet resistance of 70 to 130 Ω/□. If the sheet resistance of the polysilicon film 38 is more than 130 Ω/□, the base resistance increases. Hence, the operating speed of the device drops. If the sheen resistance of the polysilicon film 38 is less than 70 Ω/□, the impurity concentration of the extrinsic base layer formed by diffusion from the polysilicon film 38 increases, and the extrinsic base layer becomes deeper. As a result, the breakdown voltage of the device drops, or the operating speed of the device declines.

In this polysilicon film 38, furthermore, an opening 39 of 1 to 1.5 μm in width is formed. At this time, if the width of the polysilicon film 38 is less than 1 μm, processing fluctuations in pattern formation are likely to occur, and device characteristic tends to vary. If more than 1.5 μm, the capacitance increases, and the operating speed of the device is decreased.

On the inner wall of the opening 39, a nitride film 40 of 50 to 120 nm in film thickness is formed. If the film thickness of the nitride film 40 is less than 50 nm, the operating speed of the device decreases while the parasitic capacitance increases. It is also difficult to isolate electrically, and the reliability of the device is lowered. On the other hand, if the film thickness is more than 120 nm, the device characteristic deteriorates due to the stress of the film.

The nitride film 40 is removed from the region for forming the contacts of the NPN transistors 32, 33, and the underlying silicon substrate 31 is exposed.

At this time, the nitride film 40 in the region of the PNP transistor 34 is not removed and is left over.

On the side wall of the nitride film 40, a polysilicon film is formed. In the regions for forming the contacts of the NPN transistor 32, NPN transistor 33, and PNP transistor 34, the polysilicon film is removed, creating both an opening and a polysilicon side-wall 41. Here, the opening width of the nitride film 40 (area where removed) and the opening width of the polysilicon film (area where removed) formed in the NPN transistor 32 and NPN transistor 33 are equal to each other. The width of the polysilicon side-wall 41 is about 200 nm.

The width of the polysilicon side wall 41 must be optimized depending on the impurity concentration profile of each diffusion layer and precision of the processing equipment. The diffusion layer refers to, as mentioned below, an extrinsic base layer 49, an intrinsic base layer 47, an emitter layer 53, a base contact layer 50, and a collector layer 54. If the film thickness of the polysilicon side-wall 41 is great, the breakdown voltage of the device drops. At the same time, the base resistance increases. If the film thickness is small, the operating speed of the device becomes slow. Herein, the base resistance refers to the resistance of the intrinsic base layer 47, or more specifically the resistance in the overlapped region of the intrinsic base layer 47 and extrinsic base layer 49.

In the drawing, the polysilicon side-wall 41 is formed on the PNP transistor 34 or LOCOS film 37, but it is not always required to form thereon.

Thus, in the opened portion of the polysilicon side-wall 41 and nitride film 40, an emitter leading-out part opening 42 of the NPN transistor 32, and a collector leading-out part opening 43 of the NPN transistor 33 are formed.

In the emitter leading-out part opening 42 and collector leading-out part opening 43, the distance to the base leading-out electrodes 38a, 38b is about 300 nm. In other words, they are formed by self-aligned so that the distance may be always equal at any position around each opening.

In the emitter leading-out part opening 42 and collector leading-out part opening 43, an emitter leading-out electrode 44 and a collector leading-out electrode 45 are formed respectively. The emitter leading-out electrode 44 and collector leading-out electrode 45 are composed of a polysilicon film in a film thickness of about 300 nm. The polysilicon film is used in a film thickness of 200 to 350 nm. If the film thickness is greater than 350 nm, the resistance of the electrode increases. On the other hand, if the film thickness 200 is thinner than 200 nm, the current gain of the NPN transistor 32 drops. Or if the film thickness is thin, when the ions are implanted in the polysilicon film in order to lower the resistance of the electrode, the ions run through the polysilicon film, and are led into the region for forming the device within the silicon substrate 31.

At this time, a CVD oxide film 46 in a film thickness of 200 nm is formed partly on the base leading-out electrodes 38a, 38b, 38d, 38e, and the nitride film 40 is formed in the periphery. Accordingly, the base leading-out electrodes 38a, 38b, 38d, 38e, and the emitter leading-out electrode 44 or collector leading-out electrode 45 are separated electrically.

The film thickness of the CVD oxide film 46 is preferred to be 150 to 300 nm. If the film thickness is thin, the parasitic capacitance increases. If the film thickness is thick, the step on the substrate surface is formed.

In the epitaxial layer 36, a P-type intrinsic base layer 47 of the NPN transistor 32 is formed. The junction depth of the intrinsic base layer 47 is about 0.15 µm, and its surface concentration is about $1 \times 10^{19}$ cm$^{-3}$. The junction depth of the intrinsic base layer 47 should be preferably 0.1 to 0.20 µm. If smaller, the breakdown voltage of the device decreases. If greater, the operating speed of the device becomes slow.

The intrinsic base layer 47 should be used within a surface concentration range of $5 \times 10^{18}$ to $2 \times 10^{19}$ cm$^{-3}$. If the surface concentration is smaller, the breakdown voltage of the device decreases, and the base resistance of the intrinsic base layer 47 increases. If the surface concentration is high, the current gain of the NPN transistor 32 decreases, and its operating speed decreases.

Furthermore, in the epitaxial layer 36, a P-type base layer 48 of NPN transistor 33 is formed. The junction depth of the base layer 48 is about 0.5 µm, and its surface concentration is 1 to $3 \times 10^{17}$ cm$^{-3}$. The junction depth of the base layer 48 should be preferably 0.4 to 0.7 µm. If the junction depth is shallower, the thickness of the epitaxial layer 36 having a low impurity concentration becomes too thick. As a result, the operating speed of the device declines, and the operation margin of the device drops. If the junction depth is greater, to the contrary, the junction capacitance increases, and the operating speed of the device also declines. That is, in order to control the thickness of the epitaxial layer 36, it is necessary to control the junction depth of the base layer 48 at high precision.

Similarly, the impurity concentration of the base layer 48 is also an important factor. If the surface concentration of the base layer 48 is less than $1 \times 10^{17}$ cm$^{-3}$, the breakdown voltage of the device is lowered, and the margin for fluctuations in fabrication becomes small. If the surface concentration exceeds $3 \times 10^{17}$ cm$^{-3}$, the junction capacitance increases, and the operating speed of the device drops.

In the device region immediately beneath the base leading-out electrode 38a of the NPN transistor 32, a P-type extrinsic base layer 49 is formed. The extrinsic base layer 49 is formed so that its junction depth is about 0.3 µm and that the surface concentration is 1 to $3 \times 10^{20}$ cm$^{-3}$. The junction depth of the extrinsic base layer 49 is desired to be set somewhere between 0.2 and 0.35 µm. If the surface concentration of the extrinsic base layer 49 is less than $1 \times 10^{20}$ cm$^{-3}$, or if the junction depth of the extrinsic base layer 49 is less than 0.2 µm, the base resistance increases, and the breakdown voltage of the device drops. Or if the surface concentration is more than $3 \times 10^{20}$ cm$^{-3}$, and the junction depth of the extrinsic base layer 49 is more than 0.35 µm, the operating speed of the device is lowered.

In the device region immediately beneath the base leading-out electrode 38b of the NPN transistor 33, a P-type base contact layer 50 of NPN transistor 33 is formed. The base contact layer 50 is formed at a junction depth of about 0.3 µm and surface concentration of about 1 to $3 \times 10^{20}$ cm$^{-3}$. The base leading-out electrode 38b functions also as the collector leading-out electrode of the PNP transistor 34.

The junction depth of the base contact layer 50 is 0.3 µm because it is fabricated simultaneously with the extrinsic base layer 49 of the NPN transistor 32. Accordingly the fabricating condition is exactly the same as in the case of the extrinsic base layer 49, and the junction depth is preferably 0.2 to 0.35 µm.

In the device region immediately beneath the injector leading-out electrodes as the emitter leading-out electrode 38c and the collector leading-out electrode 38b of the PNP transistor 34, a P-type emitter layer 51 and a P-type collector layer 52 of the PNP transistor 34 are formed respectively. The junction depth and surface concentration of the emitter layer 51 and collector layer 52 are 0.2 to 0.35 µm, and 1 to $3 \times 10^{20}$ cm$^{-3}$, respectively, because they are fabricated simultaneously with the extrinsic base layer 49 of the NPN transistor 32.

Thus, the extrinsic base layer 49, base contact layer 50, emitter layer 51 and collector layer 52 are all in a range of junction depth of about 0.2 to 0.3 µm and surface concentration of about 1 to $3 \times 10^{20}$ cm$^{-3}$.

In the P-type intrinsic base layer 47 formed beneath the emitter leading-out electrode 44 of the NPN transistor 32, an N-type emitter layer 53 is formed at a junction depth of about 0.05 µm, and surface concentration of about $3 \times 10^{20}$ cm$^{-3}$. The junction depth of the emitter layer 53 is set at 0.03 to 0.08 µm. The surface concentration of the emitter layer 53 should be preferably 2 to $5 \times 10^{20}$ cm$^{-3}$. If the surface concentration of the emitter layer 53 is less than $2 \times 10^{20}$ cm$^{-3}$ or the junction depth is less than 0.03 µm, the parasitic resistance increases, and the operating speed of the device declines. Or if the surface concentration is $5 \times 10^{20}$ cm$^{-3}$ or more, or the junction depth is 0.08 µm or more, the parasitic capacitance increases, and the operating speed of the device decreases.

An N-type collector 54 is formed in the base layer 48 beneath the collector leading-out electrode 45 of the NPN transistor 33. The collector layer 54 is 0.05 μm in its junction depth and about $3\times10^{20}$ cm$^{-3}$ in surface concentration.

This collector layer 54 is formed simultaneously with the emitter layer 53. Accordingly, the junction depth should be properly 0.03 to 0.08 μm, and the surface concentration is desired to be 2 to $5\times10^{20}$ cm$^{-3}$. Similarly, when the surface concentration is less than $2\times10^{20}$ cm$^{-3}$ or the junction depth is less than 0.03 μm, the parasitic resistance increases, and the operating speed of the device decreases. If the surface concentration is less than $5\times10^{20}$ cm$^{-3}$, or the junction depth is more than 0.08 μm, the parasitic capacitance increases, and the operating speed of the device drops, too.

The diffusion length of each diffusion layer in the lateral direction is about 80% in the depthwise direction. The spacing of the emitter leading-out part opening 42 and collector leading out part opening 43, and the base leading-out electrodes 38a, 38b is kept around 300 nm. Therefore, the intrinsic base layer 47 and extrinsic base layer 49 of the NPN transistor 32 must be overlapped in a state of keeping a sufficient impurity concentration so as not to lower the breakdown voltage of the device or increase the resistance due to parasitic resistance. Since each electrode is formed at a specific distance from each opening, the extrinsic base layer 49 or base contact layer 50 is prevented from entering the region of emitter layer 53 or collector layer 54, respectively. If the extrinsic base layer 49 or base contact layer 50 enters the emitter layer 53 or collector layer 54, respectively, the breakdown voltage of the device is lowered, and leak increases. Besides, the operating speed of the device declines.

An embodiment of manufacturing method of a semiconductor integrated circuit of the invention is described below while referring to the process sequential sectional diagrams in FIGS. 2 (a) to (d).

First, as shown in FIG. 2 (a), at a specific resistance of about 10 Ω-cm, a window is opened in a specified region of a resist (not shown) by photolithography, on the surface of a P-type silicon substrate 61 of (111) or (100). Using this resist as mask, arsenic or antimony ions are implanted. For ion implantation, an acceleration energy of 40 to 60 keV was used at a dose of 1 to $2\times10^{15}$ cm$^{-2}$. Then the resist is removed by plasma enhanced ashing using oxygen gas. Afterwards, heat treatment is conducted for about 30 minutes at temperature of 1200° C. Thus is formed an N-type buried layer 62 in a junction depth of 1 to 2 μm and at a sheet resistance of 50 to 100 Ω/□. The buried layer 62 serves as buried collector layer 62 of vertical NPN transistor 63 having a forward direction structure capable of operating at superhigh speed, and it serves as buried emitter layer 62 of vertical NPN transistor 64 having a reverse direction structure, and it also functions as base leading-out of the lateral PNP transistor 65 in the IIL device.

On the buried layer 62, an N-type epitaxial layer 66 is grown in a thickness of 1 μm and at a specific resistance of about 0.5 Ωcm. The forming condition of the epitaxial layer 66 is the temperature of 1050° C. and pressure of about Torr, and the gas was a mixed gas of dichlorosilane (SiH$_2$Cl$_2$) and arsine (AsH$_3$).

Next, a silicon nitride film is formed on the epitaxial layer 66. The silicon nitride film was grown by low pressure CVD by using mixed gas of dichlorosilane and ammonia (NH$_3$). The film thickness of the silicon nitride film was about 120 nm.

On the silicon nitride film, a specified resist pattern (not shown) is provided by photolithography. Using this resist pattern as mask, the silicon nitride film is removed by dry etching. Dry etching is conducted by using a mixed gas of chlorofluorocarbon and bromine gas. By this etching, the silicon nitride film is removed from the position for the isolation region. Then a silicon groove is formed in the epitaxial layer 66 by dry etching. Dry etching is done by using sulfur hexafluoride (SF$_6$). The depth of the silicon groove is slightly larger than half of the film thickness of the epitaxial layer 66, or about 0.6 μm in this case.

The resist is then removed by oxygen plasma ashing. Later, a LOCOS film 67 for isolation is formed by high pressure pyrogenic oxidation at a pressure of about 8 atmospheric pressures. The LOCOS film 67 may be formed selectively by using silicon nitride film as mask. At this time, the film thickness of the LOCOS film 67 is 1 to 1.5 μm.

When the LOCOS film 67 is formed in the silicon groove in this way, the film thickness of the LOCOS film for reaching the silicon substrate 61 may be controlled to about half of the case without silicon groove. At this time, the bottom of the LOCOS film 67 is located below the bottom of the epitaxial layer 66. Thus, the film thickness of the LOCOS film 67 may be about half of usual, the oxidation time may be shortened in the process of forming the LOCOS film 67. Hence, the impurity is prevented from building up on the epitaxial layer 67 from the buried layer 62 by heat treatment at the time of oxidation.

Usually, when the LOCOS film 67 is formed, the oxidized silicon is swollen. When the silicon groove is provided, the upper surface of the LOCOS film 67 nearly coincides with the surface of the epitaxial layer 66. That is, the silicon groove is filled up with the LOCOS film 67. It thus suppresses undulations of the substrate surface caused by forming of the LOCOS film 67. If the surface is undulated, the material to be etched is left over in the recesses or steps in the anosotropic etching in a subsequent process.

Using the pyrogenic oxidation at high pressure, the oxidation rate is equal to or superior to oxidation at high temperature of 1200° C. It thus prevents the impurity of the buried layer 62 from building up and diffusing on the epitaxial layer 66 by heat treatment. By preventing the impurity from diffusing into the epitaxial layer 66 in this way, lowering of the breakdown voltage of the device may be avoided.

Furthermore, the silicon nitride film is removed by phosphoric acid solution. Then, of the device region enclosed by the LOCOS film 67, in the region forming the NPN transistor 62 in the IIL device, boron ions are implanted. This ions are implanted selectively by using as the mask the resist formed by photolithography. The ion Implantation condition is the acceleration energy of 100 to 160 keV, and the dose of $5\times10^{12}$ to $2\times10^{13}$ cm$^{-2}$. Later, the resist is removed by oxygen plasma ashing. In nitrogen atmosphere, annealing is done at temperature of 900° C. for about 30 minutes. As a result the base layer of NPN transistor 64 is formed.

Next, as shown in FIG. 2 (b), a polysilicon film 69 is formed as the base leading-out electrode of NPN transistor 63, base leading-out electrode of NPN transistor 64, and injector leading-out electrode. The polysilicon film 69 is formed in a film thickness of about 400 nm by low pressure CVD. Then, as the insulation film between polysilicon electrodes, an oxide film 70 is formed in a film thickness of about 250 nm. The oxide film 70 is formed by low pressure CVD using a mixed gas of dichlorosilane and N$_2$O gas.

Consequently, boron ions are implanted as the impurity diffusion source for the extrinsic base layer of NPN transistor 63, base contact layer of NPN transistor 64, and emitter layer and collector layer of PNP transistor 65. The ion implantation condition is the dose of $1 \times 10^{16}$ cm$^{-2}$, and acceleration energy of 60 keV approximately. When ions are implanted in such condition, the boron runs through the oxide film 37, and ions are introduced into the polysilicon film 69.

It is intended to prevent the boron from being implanted into the surface of the epitaxial layer 66, therefore, ion implantation to the polysilicon film 69 is done after forming the oxide film 70. That is, when growing the oxide film 70 by low pressure CVD, heat treatment of about 800° C. is done. At this time, if boron ions have been already implanted on the polysilicon film 69, the boron is diffused in solid phase and is introduced into the surface of the epitaxial layer 66. When boron is introduced, in the NPN transistors 63, 64, if attempted to form a shallow base in a later process, the base layer becomes deep. As a result, the high frequency characteristic of the device is lowered. In the PNP transistor 65, leak current between the collector and emitter are likely to occur due to the introduced boron.

Using the resist pattern (not shown) opened in a width of 1 to 2 μm as the mask, dry etching is performed in a mixed gas of CHF$_3$, ammonia and oxygen, and the oxide film 70 is removed. Continuously, using a mixed gas of SF$_6$ and C$_2$ClF$_5$, the polysilicon film 69 is anisotropically etched and removed. In this way, each polysilicon electrode is formed, and at the same time openings are made in the region 71 as the base of the NPN transistors 63, 64, and the region 72 as the base of the PNP transistor 65. Then, the resist pattern is removed by oxygen plasma ashing. Afterwards, on the entire surface, a silicon nitride film 73 is grown in a film thickness of 120 nm. The silicon nitride film 73 is grown by low pressure CVD using a mixed gas of dichlorosilane and ammonia.

The silicon nitride film 73 electrically isolates the polysilicon electrodes individually. Accordingly, a sufficient film thickness is needed for the reliability. However, if the film thickness is too much, the device characteristic deteriorates due to stress of the silicon nitride film 73. Therefore, the film thickness of the silicon nitride film 73 having a sufficient insulation characteristic and not causing deterioration due to stress is 50 to 120 nm.

Subsequently, heat treatment is conducted for 30 to 60 minutes in nitrogen gas atmosphere at temperature of about 1000° C. As a result, the boron impurity in the polysilicon film 69 diffuses in the surface of the epitaxial layer 66. Thus is formed the P-type diffusion layer 74 as the base contact layer of the NPN transistors 63, 64 and emitter layer and collector layer of the PNP transistor 65. Each diffusion layer is about 03 μm in junction depth, and about 1 to $3 \times 10^{20}$ cm$^{-3}$ in surface concentration.

Next, as shown in FIG. 2 (c), a polysilicon film is grown on the entire surface of the silicon nitride film 73. The polysilicon film is grown in a thickness of about 200 to 300 nm by low pressure CVD using silane gas. Consequently, the polysilicon film is subjected to an extremely anisotropic etching. Anisotropic etching is realized in a mixed gas of SF$_6$ and CCl$_4$. In this way, a polysilicon side-wall 75 is formed. Using this polysilicon side-wall 75 and the resist (not shown) formed by photolithography as the mask, the silicon nitride film 73 is etched in a mixed gas of CF$_4$ and CHBr$_3$ and O$_2$. Thus are formed, by self-aligned technology, an emitter leading-out part opening 76 of the NPN transistor 63 and collector leading-out part opening 77 of the NPN transistor 64 so as to be equal in distance at any position on the periphery of the opening from the polysilicon film 69 as the base leading-out electrode.

For self-aligned forming of the emitter leading-out part opening 76 and collector leading-out part opening 77, the silicon nitride film 73 and polysilicon side-wall 75 are formed in two layers. The reason is that the effect as protective film is expected when the emitter junction of NPN transistor 63 or collector junction of NPN transistor 64 is covered with the silicon nitride film 73. That is, it is effective to prevent the impurity from entering the peripheral part of the emitter junction of the NPN transistor 63 by the film or extrinsic atmosphere in the process after forming the silicon nitride film 73. If the impurity is trapped in the interface level existing near the peripheral surface of the emitter junction, the current gain of the device deteriorates, and other disadvantage occur in the reliability of the device. Besides, since the coefficient of thermal expansion of polysilicon is equal to that of the silicon substrate, the stress of the polysilicon side-wall 75 is far smaller than that of the silicon nitride film 73. Hence, by forming the silicon nitride film 73 as thinly as possible, the portion of this thickness is covered by the polysilicon side-wall 75. Accordingly, the reliability of the device will not be impaired by the stress of the silicon nitride film 73.

Finally, as shown in FIG. 2 (d), by the polysilicon film, a polysilicon electrode 78 is formed as the emitter leading-out electrode of NPN transistor 63 and collector leading-out electrode of NPN transistor 64. The polysilicon film is grown to a thickness of about 300 nm by low pressure CVD, using silane gas. The polysilicon electrode 78 is formed by etching the polysilicon film by using a mixed gas of SF$_6$ and C$_2$ClF$_5$, using the resist employed in photolithography as the mask.

Afterwards, using the resist pattern employed in opening the region of the polysilicon electrode 78 as the mask, boron ions are implanted in the polysilicon electrode 78.

Later, the resist is removed by oxygen plasma ashing. Then heat treatment is done in nitrogen atmosphere. By this heat treatment, the boron impurity in the polysilicon electrode 78 is diffused on the surface of the epitaxial layer 66 through the emitter leading-out part opening 76. By the boron diffused on the surface of the epitaxial layer 66, a P-type base layer 79 of the NPN transistor 63 is formed.

Consequently, exposing and developing to open the region of the polysilicon electrode 78, a resist pattern is formed. Using this resist pattern as mask, arsenic ions are implanted in the polysilicon electrode 78. The ion implantation is conducted at acceleration energy of 40 to 80 keV, and dose of $5 \times 10^{15}$ to $2 \times 16^{16}$ cm$^{-2}$.

In sequence, the resist is removed by oxygen plasma ashing. Then heat treatment is done in nitrogen atmosphere. By this heat treatment, the arsenic impurity in the polysilicon electrode 78 runs through the emitter leading-out part opening 76 and collector leading-out part opening 77, and is diffused on the surface of the epitaxial layer 66. By the arsenic diffused on the surface of the epitaxial layer 66, the N$^+$ diffusion layer 80 is formed as the N-type emitter layer of NPN transistor, and N-type collector layer of NPN transistor 64 in the IIL device.

Here, when implanting boron ions into the polysilicon electrode 78 of the NPN transistor 63, boron should not run through the polysilicon electrode 78. Accordingly, the ion implantation condition is the acceleration energy of 30 keV or less, and the dose of 2 to $4 \times 10^{14}$ cm$^{-2}$. By subsequent heat treatment at 900° to 950° C. for 30 to 60 minutes, the P-type base layer 79 of NPN transistor 63 is formed at the surface concentration of about $1 \times 10^{19}$ cm$^{-3}$, and the diffusion depth of about 0.1 to 0.15 μm.

The N⁺ diffusion layer 80 may be formed at a surface concentration of about 3×10²⁰ cm⁻³, and a depth of 0.05 μm or less by heat treatment at 900° C. for about 30 minutes.

Since the diffusion length of each diffusion layer in the lateral direction is about 80%, the diffusion layer 74 may be overlapped with the base layer 79 around the emitter leading-out part opening 76 while keeping a sufficient impurity concentration. At the same time, junction of N⁺ diffusion layer 80 and P⁺ diffusion layer 74 can be prevented. Since the both diffusion layer 74, 80 are high in the impurity concentration, if they are joined, a tunnel current is generated. Accordingly, in the reverse bias, a leak current occurs, or in the forward bias, the linearity of the current gain of device is lowered. To prevent such phenomena, it is desired that the impurity concentration of one of the diffusion layers be not more than 1×10¹⁸ cm⁻³.

In this way, the boron ions implanted in the polysilicon electrode 78 of the NPN transistor 63 are diffused through the emitter leading-out part opening 76 by heat treatment. Accordingly, the base layer 79 of the NPN transistor 63 may be formed extremely thinly.

Besides, by anisotropic dry etching of the polysilicon film 69, damage is caused in the base region 71 of the NPN transistor. The anisotropic dry etching of the polysilicon film 69 is used for forming the base leading-out electrode of NPN transistor 63, the base leading-out electrode of NPN transistor 64 serving also as the collector leading-out electrode of PNP transistor 65, and injector leading-out electrode as the emitter leading-out electrode of PNP transistor 65. The damage thus formed in the base region 71 propagates into the substrate by ion implantation when forming the base layer 79. If it further leads to the junction of diffusion layer, should the junction become reverse biased, the leak current increases, and the product yield may decline.

This may be avoided by using the diffusion from the polysilicon film.

The process of forming the base layer 68 of the NPN transistor 64 for composing the IIL device by ion implantation must be set before the process of forming the polysilicon electrode by anisotropic dry etching of the polysilicon film 69 for the same reason as above.

Meanwhile, the base layer 68 of the NPN transistor 64 is formed relatively deep. Accordingly, same as the NPN transistor 63, when formed by boron diffusion from the polysilicon electrode 78, an extremely shallow base layer 68 is formed. If the base layer 68 is shallow, the thickness of the epitaxial layer 66 having a low impurity concentration to be used as the emitter increases. As a result, the operation speed of the device drops.

Hence, when the base layer 68 of the NPN transistor 64 is formed by using ion implantation after forming the base electrode, the problem of damage because of ion implantation takes place. When forming by diffusion from the polysilicon film, instead of ion implantation, another problem is that the depth of the base layer 68 is shallow. Accordingly, as in this embodiment, by forming the base electrode after forming the base layer 68 of the NPN transistor 64 by ion implantation, the problems relating to damage and depth of base layer may be solved.

What is claimed is:

1. A method of fabricating a semiconductor integrated circuit device which has a bipolar transistor and an IIL device produced by using a self-aligned method comprising the steps of:

forming a semiconductor layer of a second conductive type on a semiconductor substrate of a first conductive type, wherein the semiconductor layer has at least a first and second semiconductor element region, said first semiconductor element region within said IIL device;

forming a first diffusion layer of the first conductive type in the first semiconductor element region on the semiconductor layer;

forming a first polycrystalline semiconductor film on the semiconductor substrate;

forming a first insulating film on the first polycrystalline semiconductor film;

introducing a first impurity of the first conductive type into the first polycrystalline semiconductor film;

forming a first opening by selectively etching and removing the first insulating film and first polycrystalline semiconductor film;

forming a second insulating film at least in the first opening;

forming a second diffusion layer of the first conductive type by introducing the first impurity into the semiconductor layer;

forming a second opening in the second insulating layer;

growing a second polycrystalline semiconductor film in the second opening;

introducing a second impurity of the first conductive type selectively into the second polycrystalline semiconductor film in the second semiconductor element region;

forming a third diffusion layer by introducing the second impurity into the semiconductor layer through the second opening;

introducing a third impurity of the second conductive type into the second polycrystalline semiconductor film;

and forming a fourth diffusion layer of the second conductive type by introducing the third impurity into the semiconductor layer through the second opening.

2. A method of fabricating a semiconductor integrated circuit device which has a bipolar transistor and an IIL device produced by using a self-aligned method comprising the steps of:

forming a semiconductor layer of a second conductive type on a semiconductor substrate of a first conductive type wherein the semiconductor layer has at least a first and second semiconductor element region, said first semiconductor element region within said IIL device;

forming a first diffusion layer of the first conductive type in the first semiconductor element region of the semiconductor layer;

forming a first polycrystalline semiconductor film on the semiconductor substrate;

forming a first insulating film on the first polycrystalline semiconductor film;

introducing a first impurity of the first conductive type in the first polycrystalline semiconductor film;

forming a first opening by selectively etching and removing the first insulating film and first polycrystalline semiconductor film;

forming a second insulating film at least within the first opening;

forming a second diffusion layer of the first conductive type by introducing the first impurity into the semiconductor layer;

forming a second polycrystalline semiconductor element film on the second insulating film;

forming a second opening in the second insulating film and second polycrystalline semiconductor film;

growing a third polycrystalline semiconductor film at least within the second opening;

introducing a second impurity of the first conductive type selectively in the third polycrystalline semiconductor film of the second semiconductor element region;

forming a third diffusion layer by introducing the second impurity into the semiconductor layer through the second opening;

introducing a third impurity of the second conductive type into the third polycrystalline semiconductor film;

and forming a fourth diffusion layer of the second conductive type by introducing the third impurity into the semiconductor layer through the second opening.

* * * * *